United States Patent
Otori

(10) Patent No.: US 10,847,437 B2
(45) Date of Patent: Nov. 24, 2020

(54) SEMICONDUCTOR DEVICE

(71) Applicant: Mitsubishi Electric Corporation, Tokyo (JP)

(72) Inventor: Daichi Otori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/451,857

(22) Filed: Jun. 25, 2019

(65) Prior Publication Data

US 2020/0118903 A1 Apr. 16, 2020

(30) Foreign Application Priority Data

Oct. 10, 2018 (JP) ................... 2018-191657

(51) Int. Cl.
*H01L 23/367* (2006.01)
*H01L 23/049* (2006.01)
(Continued)

(52) U.S. Cl.
CPC .......... *H01L 23/367* (2013.01); *H01L 23/049* (2013.01); *H01L 23/31* (2013.01);
(Continued)

(58) Field of Classification Search
CPC ..... H01L 23/367; H01L 23/564; H01L 23/62; H01L 25/10–18; H01L 23/31;
(Continued)

(56) References Cited

U.S. PATENT DOCUMENTS 5,536,972 A * 7/1996 Kato ................... H01L 23/3121
257/706
6,313,598 B1 * 11/2001 Tamba ................... H01L 25/04
318/722
(Continued)

FOREIGN PATENT DOCUMENTS

JP H4-162488 * 6/1992 ............... H05K 1/16
JP H04-162489 A 6/1992
(Continued)

OTHER PUBLICATIONS

Machine translation, Nomura, WIPO Pat. Pub. No. 2019/216299, translation date: Jul. 27, 2020, Espacenet, all pages. (Year: 2020).*
(Continued)

*Primary Examiner* — Victoria K. Hall
(74) *Attorney, Agent, or Firm* — Studebaker & Brackett PC

(57) ABSTRACT

An object is to provide a technique capable of increasing a heat radiation property in radiating a heat generated in a shunt resistance. A semiconductor device includes: a container body having a space with an opening; a semiconductor chip, a shunt resistance, and a circuit pattern disposed in the space in the container body; a partition member; a first cover; and a second cover. The partition member separates the space in the container body into a first space and a second space. The first cover covers a part of the opening corresponding to the first space, and the second cover covers a part of the opening corresponding to the second space. At least one hole through which the second space and outside of the container body are communicated with each other is formed in the second cover or by the second cover.

9 Claims, 4 Drawing Sheets

(51) Int. Cl.
*H01L 23/482* (2006.01)
*H01L 23/00* (2006.01)
*H01L 23/31* (2006.01)
*H01L 23/62* (2006.01)

(52) U.S. Cl.
CPC ........ *H01L 23/4821* (2013.01); *H01L 23/564* (2013.01); *H01L 23/62* (2013.01)

(58) Field of Classification Search
CPC ......... H01L 23/28–3192; H01L 23/049; H01L 23/4821; H01L 2924/181; H01L 2924/19107; H01L 2924/00012; H01L 2224/73265; H01L 23/24; H01L 23/2725; H01L 23/053; H01L 23/562; H01L 23/467; H05K 5/0047; H05K 5/0052
USPC ................. 257/678–733, 787–796; 361/765; 438/106, 126, 127
See application file for complete search history.

(56) References Cited

U.S. PATENT DOCUMENTS

| | | | | |
|---|---|---|---|---|
| 10,501,031 | B2 * | 12/2019 | Kaneko | ............... H05K 5/0069 |
| 2015/0091551 | A1 * | 4/2015 | Kanschat | ............... H01C 17/00 324/126 |
| 2015/0162327 | A1 * | 6/2015 | Niiyama | ................ H01G 4/012 257/529 |
| 2017/0063071 | A1 * | 3/2017 | Yoneyama | .......... H01L 29/2003 |
| 2020/0086812 | A1 * | 3/2020 | Kaneko | ............... B60R 16/0238 |

FOREIGN PATENT DOCUMENTS

| | | | | | |
|---|---|---|---|---|---|
| JP | | H4-162690 | * | 6/1992 | ............... H05K 1/16 |
| JP | | 2523055 | * | 5/1996 | ............... H05K 1/16 |
| WO | WO-2016199635 | A1 | * | 12/2016 | ............. H01L 23/28 |
| WO | WO 019216299 | A1 | * | 11/2019 | ............... H05K 9/00 |

OTHER PUBLICATIONS

Machine translation, Hanada, WIPO Pat. Pub. No. 2016/199635, translation date: Jul. 27, 2020; Espacenet, all pages. (Year: 2020).*
Machine translation, Kazami, Japanese Pat. Pub. No. H4-162488 and JP 2523055; translation date: Jul. 27, 2020; Espacenet, all pages. (Year: 2020).*
Machine translation, Kazami, Japanese Pat. Pub. No. JP H4-162690; translation date: Jul. 27, 2020; Espacenet, all pages. (Year: 2020).*

* cited by examiner

SEMICONDUCTOR DEVICE

FIELD OF THE INVENTION

The present invention relates to a semiconductor device including a shunt resistance.

DESCRIPTION OF THE BACKGROUND ART

Recently, a semiconductor device having a built-in shunt resistance capable of detecting a circuit current with a high degree of accuracy is applied to various devices. Since a temperature of the shunt resistance rises when a current is applied, an available shunt resistance is restricted due to an upper temperature limit of a sealing member sealing the shunt resistance, for example. Thus, in a semiconductor device used in an order of several amperes, for example, a heat radiation effect is improved by increasing the number of shunt resistances, however, there arises another problem that a size of the device increases as a result thereof. In a technique in Japanese Patent Application Laid-Open No. 4-162489, a wall, for example, for separating the shunt resistance from the other constituent elements is provided to solve the problem that the available shunt resistance is restricted due to the upper temperature limit of the sealing member.

SUMMARY

In the technique in Japanese Patent Application Laid-Open No. 4-162489, the shunt resistance is not sealed by the sealing member but is provided in a space in a case. However, this space is completely enclosed, so that there is a problem that a heat radiation property in radiating the heat generated in the shunt resistance is relatively low.

The present invention has been made to solve the above-mentioned problems and an object of the present invention is to provide a technique capable of increasing a heat radiation property in radiating the heat generated in the shunt resistance.

The present invention is a semiconductor device including: a container body including a space with an opening; a semiconductor chip disposed in the space in the container body; a shunt resistance disposed in the space to be separated from the semiconductor chip; a circuit pattern disposed in the space to connect the semiconductor chip and the shunt resistance; partition member separating the space in the container body into a first space on a side of the semiconductor chip and a second space on a side of the shunt resistance; a first sealing member disposed in the first space to seal the semiconductor chip; and a first cover covering a part of the opening corresponding to the first space and a second cover covering a part of the opening corresponding to the second space. At least one hole through which the second space and outside of the container body are communicated with each other is formed in the second cover or by the second cover.

A heat radiation property in radiating a heat generated in the shunt resistance can be increased.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
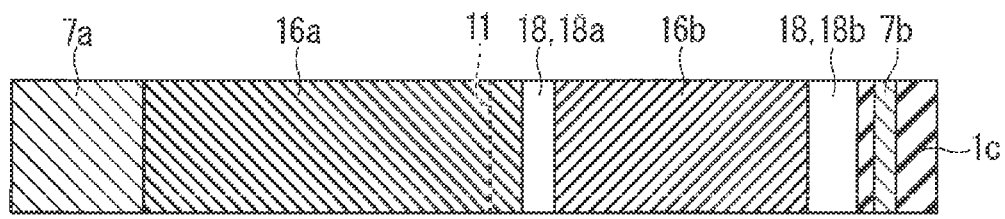
FIG. 1 is a plan view illustrating a configuration of a semiconductor device according to an embodiment 1.
Figure 2:
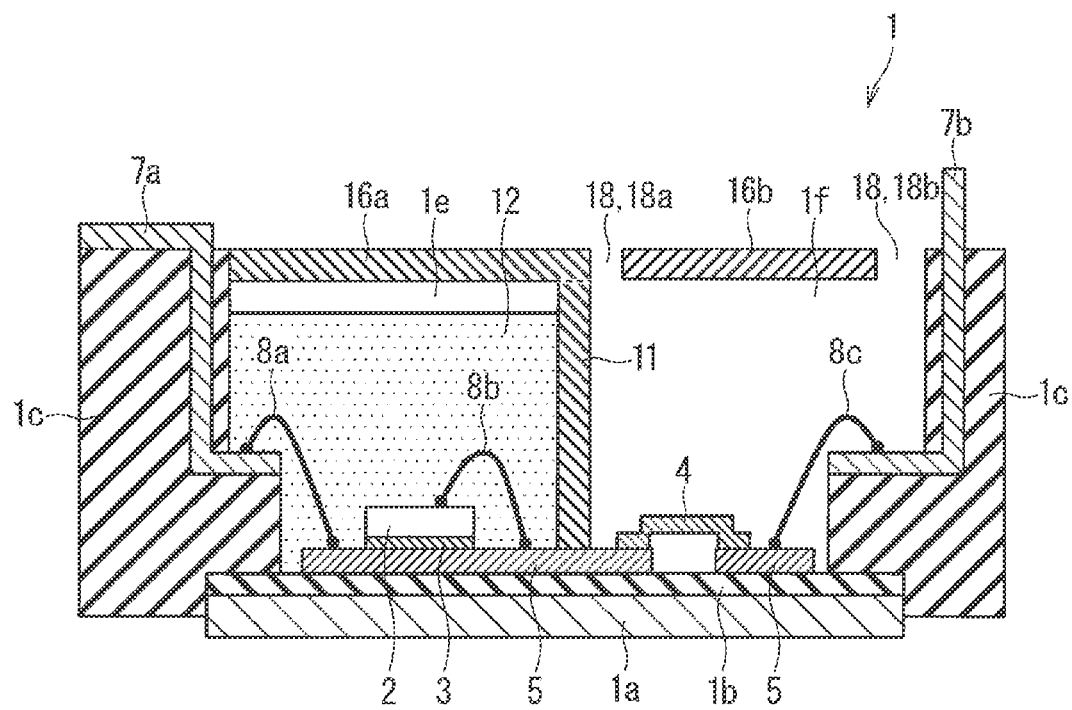
FIG. 2 is a cross-sectional view illustrating a configuration of the semiconductor device according to the embodiment 1.

FIG. 1 is a plan view illustrating a configuration of a semiconductor device according to an embodiment 1 of the present invention, and FIG. 2 is a cross-sectional view illustrating the configuration.

The semiconductor device illustrated in FIG. 2 includes a container body 1, a semiconductor chip 2, a joint material 3, a shunt resistance 4, a circuit pattern 5, electrodes 7a and 7b, wirings 8a, 8b, and 8c, a partition member 11, a first sealing member 12, a first cover 16a, and a second cover 16b.

The container body 1 has a space with an opening on an upper side, and the semiconductor chip 2 and the shunt resistance 4 are disposed in the space in the container body 1 in a state of being separated from each other. In the present embodiment 1, the container body 1 has a base plate 1a, an insulating substrate 1b, and a case 1c but is not limited thereto.

Figure 3:
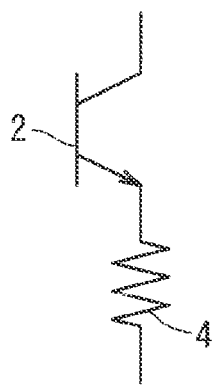
FIG. 3 is a circuit diagram illustrating a configuration of a part of the semiconductor device according to the embodiment 1.

A conductive circuit pattern 5 is disposed on an upper surface which is one main surface of the insulating substrate 1b, and the base plate 1a is disposed on a lower surface which is the other main surface of the insulating substrate 1b. An upper portion of the circuit pattern 5 is joined to the semiconductor chip 2 and the shunt resistance 4 by the conductive joint member 3. Accordingly, the circuit pattern 5 electrically connects the semiconductor chip 2 and the shunt resistance 4 as illustrated in FIG. 3. The semiconductor chip 2 is an insulated gate bipolar transistor (IOBT) in FIG. 3, however, the semiconductor chip 2 is not limited thereto, but may be a metal oxide semiconductor field effect transistor (MOSFET), a Schottky barrier diode (SBD), or a PN diode, for example.

The case 1c in FIG. 2 surrounds lateral sides of the semiconductor chip 2 and the shunt resistance 4, and a lower portion of the case c is blocked by the insulating substrate 1b and the base plate 1a.

The electrode 7a and the electrode 7b are fixed to the case 1c in a state of being separated from each other. The electrode 7a is electrically connected to the circuit pattern 5 via the wiring 8a, thus the circuit pattern 5 and a part of the electrode 7a located outside the container body 1 are electrically connected to each other. The electrode 7b is electrically connected to the circuit pattern 5 via the wiring 8c, thus the circuit pattern 5 and a part of the electrode 7b located outside the container body 1 are electrically connected to each other. The wiring 8b electrically connects the semiconductor chip 2 and the circuit pattern 5.

The partition member 11 separates the space in the container body 1 into a first space 1e on a side of the semiconductor chip 2 and a second space 1f on a side of the shunt resistance 4. As illustrated in FIG. 1 and FIG. 2, in a plan view, a part of the semiconductor device corresponding to the first space 1e is "a semiconductor chip mounting part", and a part of the semiconductor device corresponding to the second space 1f is "a shunt resistance mounting part".

A first sealing member 12 is disposed in the first space 1e to seal the semiconductor chip 2. In the present embodiment 1, the first sealing member 12 seals not only the semiconductor chip 2 but also the wirings 8a and 8b and the circuit pattern 5 in the first space 1e, however, the configuration is not limited thereto. In the meanwhile, the sealing member is not disposed in the second space 1f. In the example in FIG. 2, a center portion of the shunt resistance 4 is disposed on a notch of the circuit pattern 5, thus an area of the center portion contacting air is relatively large.

The first cover 16a is a cover of the semiconductor chip mounting part, and covers a part of the opening of the container body 1 corresponding to the first space 1e. The second cover 16b is a cover of the shunt resistance mounting part, and covers a part of the opening of the container body 1 corresponding to the second space 1f. At least one hole 18 through which the second space 1f and the outside of the container body 1 are communicated with each other is formed in the second cover 16b or by the second cover 16b. In the present embodiment 1, the at least one hole 18 includes a hole 18a on one end side of the second cover 16b and a hole 18b on the other end side thereof in a plan view. The hole 18a is formed between one end portion of the second cover 16b and the partition member 11, and the hole 18b is formed between the other end portion of the second cover 16b and the case 1c.

The partition member 11 is integrated with the first cover 16a in FIG. 3, however, the configuration is not limited thereto. For example, the partition member 11 may be integrated with the case 1c of the container body 1, or may be integrated with the second cover 16b.

According to the semiconductor device according the present embodiment 1 having the configuration described above, the at least one hole 18 through which the second space 1f and the outside of the container body 1 are communicated with each other is formed in the second cover 16b or by the second cover 16b. According to the configuration described above, the air receiving the heat of the shunt resistance 4 can be moved outside the container body 1 from the second space 1f via the hole 18. Accordingly, the heat of the shunt resistance 4 can be efficiently radiated outside the container body 1, thus a heat radiation property (an air cooling effect) can be increased. As a result, even if the temperature of the shunt resistance 4 exceeds 200° C. in a configuration that a gel or an epoxy resin which is a general sealing member is adopted to the first sealing member 12, for example, a decrease in electrical characteristics or a life shortening of the semiconductor device can be reduced.

In the present embodiment 1, the at least one hole 18 includes the two holes 18a and 18b, but may be one hole. The at least one hole 18 is preferably formed in a position other than an upper side of the shunt resistance 4. According to the configuration described above, the shunt resistance 4 can be protected from a physical damage while securing the heat radiation property.

Embodiment 2

Figure 4:
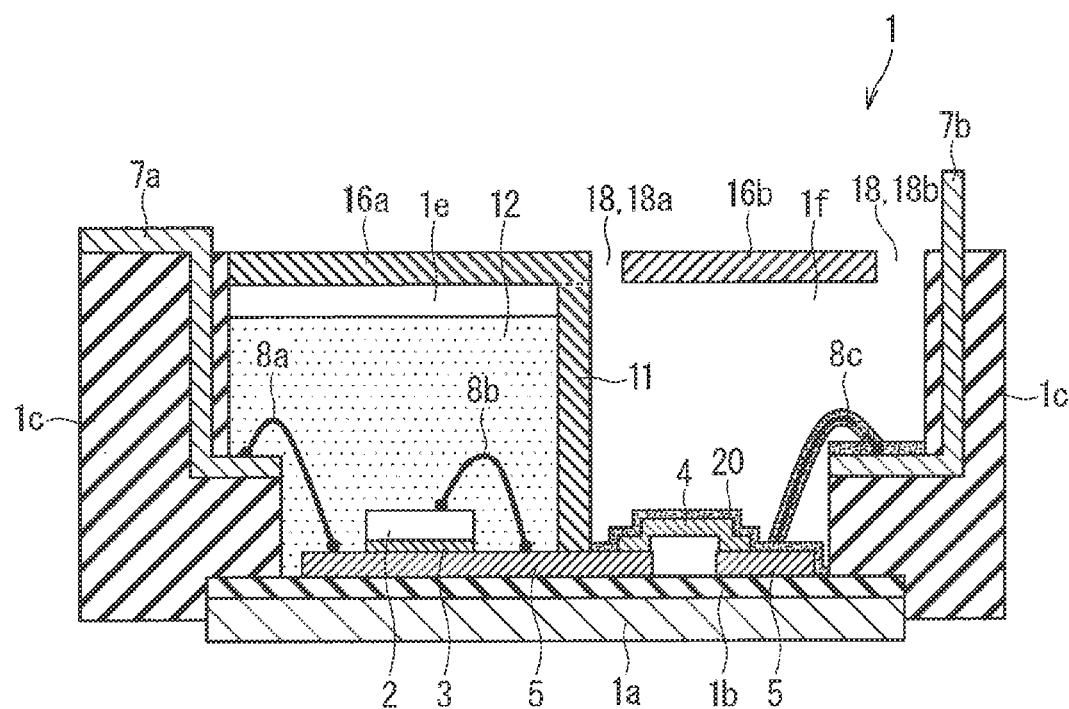
FIG. 4 is a cross-sectional view illustrating a configuration of a semiconductor device according to an embodiment 2.

FIG. 4 is a cross-sectional view illustrating a configuration of a semiconductor device according to an embodiment 2 of the present invention. The same reference numerals as those described in the embodiment 1 will be assigned to the same or similar constituent element in the configuration according to the embodiment 2, and the different constituent elements are mainly described hereinafter.

In the present embodiment 2, at least a part of a structure including the shunt resistance 4 and the circuit pattern 5 in the second space 1f is covered by an anticorrosive film 20. In the present embodiment 2, the electrode 7b and the wiring 8c are also covered by the anticorrosive film 20. The anticorrosive film 20 is formed by spraying (applying) a volatile corrosion inhibitor made of a reactive material of dicyclohexylamine and octanoic acid or a material containing the volatile corrosion inhibitor, for example, in the second space 1f.

According to the semiconductor device according to the present embodiment 2 having the configuration described above, the anticorrosive film 20 can reduce an oxidation and sulfurization of the shunt resistance 4 and the circuit pattern 5, for example.

Embodiment 3

Figure 5:
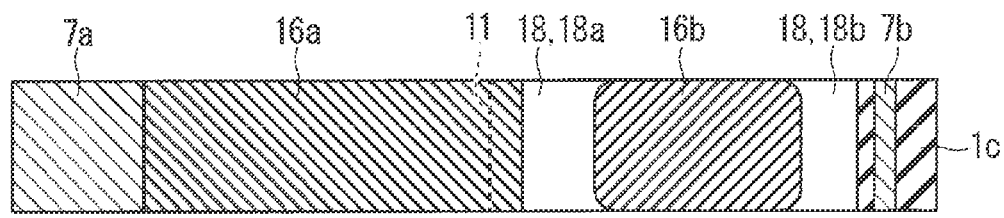
FIG. 5 is a plan view illustrating a configuration of a semiconductor device according to an embodiment 3.
Figure 6:
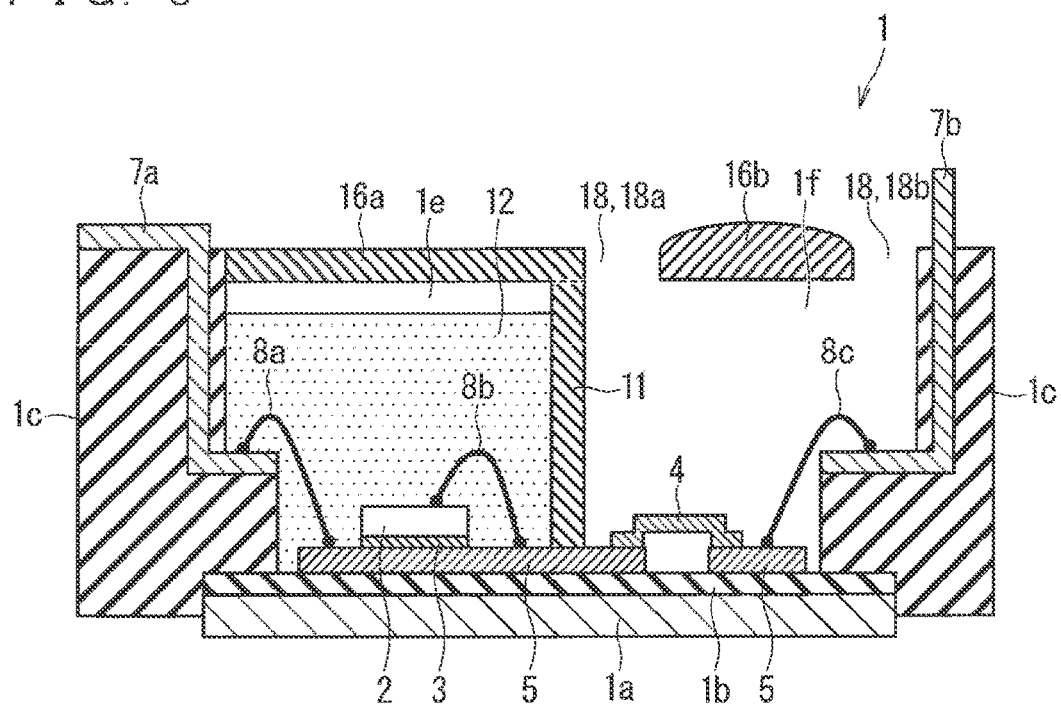
FIG. 6 is a cross-sectional view illustrating the configuration of the semiconductor device according to the embodiment 3.

FIG. 5 is a plan view illustrating a configuration of a semiconductor device according to an embodiment 3 of the present invention, and FIG. 6 is a cross-sectional view illustrating the configuration. The same reference numerals as those described in the above embodiments will be assigned to the same or similar constituent element in the configuration according to the embodiment 3, and the different constituent elements are mainly described hereinafter.

Also in the present embodiment 3, in the manner similar to the embodiment 1, the at least one hole 18 includes the hole 18a on the one end side of the second cover 16b and the hole 18b on the other end side thereof in a plan view. However, in the present embodiment 3, a shape of an upper surface of the second cover 16b and a shape of a lower surface thereof are different from each other in a cross-sectional view. The configuration that the shape of the upper surface and the shape of the lower surface are different from each other includes not only a configuration that the upper surface is a curved surfaces and the lower surface is a flat surface as illustrated in FIG. 6 but also a configuration that a surface area of the upper surface and a surface area of the lower surface are different from each other or a configuration that a gradient of the upper surface with respect to a horizontal direction and a gradient of the lower surface with respect to a horizontal direction are different from each other, for example.

According to the semiconductor device according to the present embodiment 3 having the configuration described above, a difference occurs between a flow rate of a wind flowing along the upper surface and a flow rate of a wind flowing along the lower surface, and Karman vortex occurs. The Karman vortex can agitate the air in the second space 1f, thus the heat radiation property can further be increased.

Embodiment 4

Figure 7:
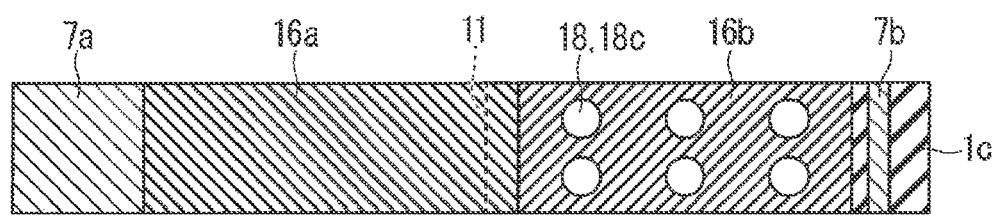
FIGS. 7 to 9 are plan views illustrating a configuration of a semiconductor device according to an embodiment 4.

FIG. 7 is a plan view illustrating a configuration of a semiconductor device according to an embodiment 4 of the present invention. The same reference numerals as those described in the above embodiments will be assigned to the same or similar constituent element in the configuration according to the embodiment 4, and the different constituent elements are mainly described hereinafter.

In the present embodiment 4, at least one hole is a plurality of holes 18c disposed in the second cover 16b. The plurality of holes 18c are preferably disposed in a position other than an upper side of the shunt resistance 4. According to the semiconductor device according to the present embodiment 4 described above, the shunt resistance 4 can be protected from a physical damage, thus a lifetime extension can be expected, for example. Each of the plurality of holes 18c has a function as a vent hole radiating the heat of the shunt resistance 4 outside, thus can improve the air cooling effect.

Figure 8:
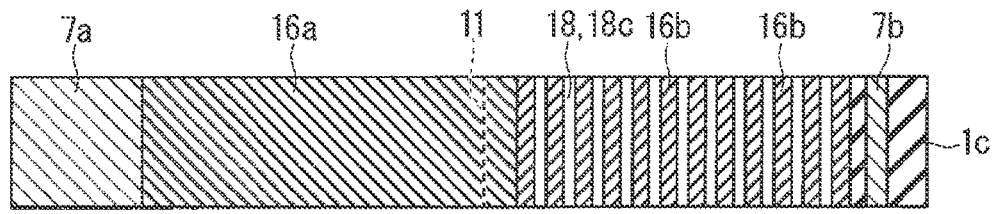
Figure 9:
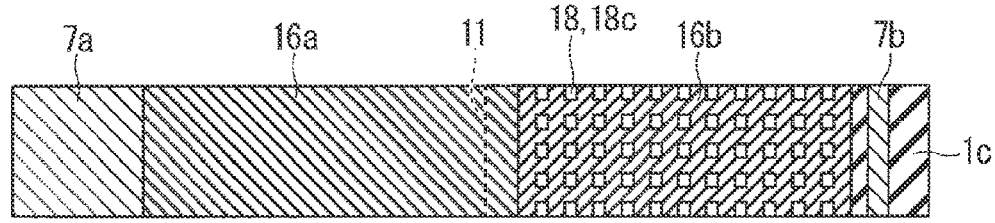

The plurality of holes 18c are not limited to circular-shaped holes. For example, the plurality of holes 18c may be slits as illustrated in FIG. 8. Also in such a configuration, the effect similar to that of the configuration in FIG. 7 can be obtained. For example, as illustrated in FIG. 9, the second cover 16b may have a meshed pattern, and the plurality of holes 18c may be holes defined by the pattern. Also in such a configuration, the effect similar to that of the configuration in FIG. 7 can be obtained.

Embodiment 5

Figure 10:
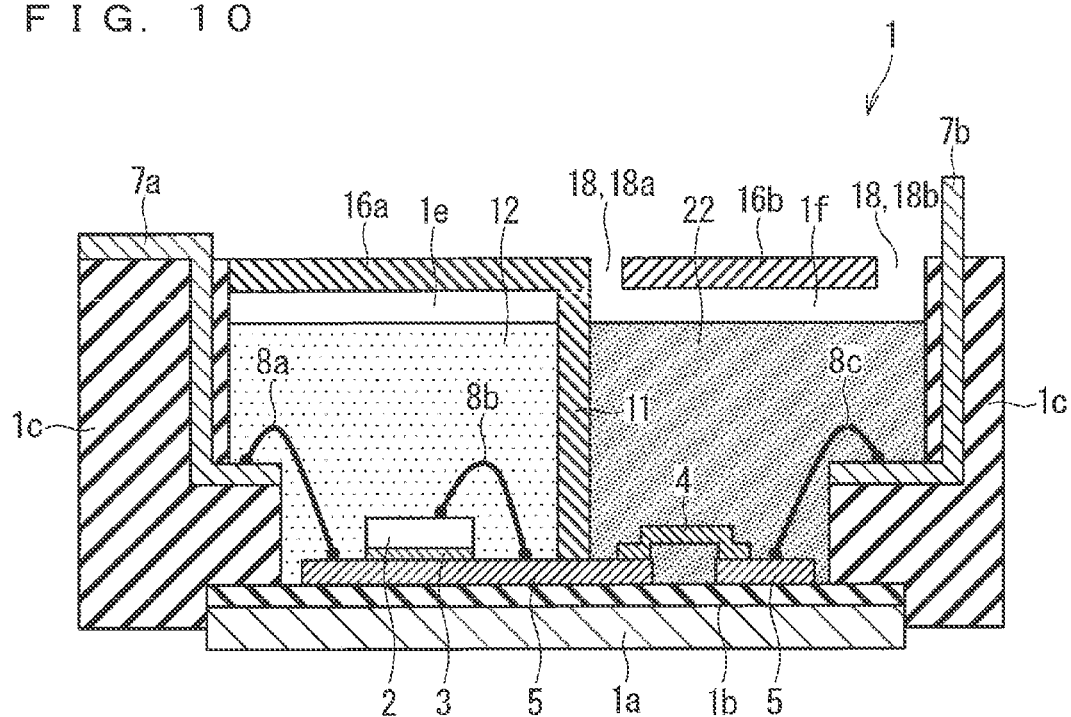
FIG. 10 is a cross-sectional view illustrating a configuration of a semiconductor device according to an embodiment 5.

FIG. 10 is a cross-sectional view illustrating a configuration of a semiconductor device according to an embodiment 5 of the present invention. The same reference numerals as those described in the above embodiments will be assigned to the same or similar constituent element in the configuration according to the embodiment 5, and the different constituent elements are mainly described hereinafter.

A configuration of the present embodiment 5 is similar to the configuration of the embodiment 1 (FIG. 2) except that a second sealing member 22 is added. The second sealing member 22 is disposed in the second space 1f to seal the shunt resistance 4. A material of the first sealing member 12 and a material of the second sealing member 22 are different from each other. For example, a gel or an epoxy resin which is a general sealing member is adopted to the first sealing member 12, and a sealing member having a heat resistance higher than the general sealing member is adopted to the second sealing member 22. According to the semiconductor device according to the present embodiment 5 described above, the sealing member appropriate for each of the semiconductor chip 2 and the shunt resistance 4 can be used.

According to the present invention, the above embodiments can be arbitrarily combined, or each embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a container body including a space with an opening;
a semiconductor chip disposed in the space in the container body;
a shunt resistance disposed in the space to be separated from the semiconductor chip;
a circuit pattern disposed in the space to connect the semiconductor chip and the shunt resistance;
partition member separating the space in the container body into a first space on a side of the semiconductor chip and a second space on a side of the shunt resistance;
a first sealing member disposed in the first space to seal the semiconductor chip; and
a first cover covering a part of the opening corresponding to the first space and a second cover covering a part of the opening corresponding to the second space, wherein
at least one hole through which the second space and outside of the container body are communicated with each other is formed in the second cover or by the second cover.

2. The semiconductor device according to claim 1, wherein
at least a part of a structure including the shunt resistance and the circuit pattern in the second space is covered by an anticorrosive film.

3. The semiconductor device according to claim 1, wherein
the at least one hole includes a hole on one end side of the second cover and a hole on another end side of the second cover in a plan view, and
a shape of an upper surface of the second cover and a shape of a lower surface of the second cover are different from each other in a cross-sectional view.

4. The semiconductor device according to claim 1, wherein
the at least one hole includes a plurality of holes disposed in the second cover.

5. The semiconductor device according to claim 4, wherein
the plurality of holes include slits.

6. The semiconductor device according to claim 4, wherein
the second cover has a meshed pattern, and
the plurality of holes include holes defined by the pattern.

7. The semiconductor device according to claim 1, further comprising
a second sealing member disposed in the second space to seal the shunt resistance, and
a material of the first sealing member and a material of the second sealing member are different from each other.

8. The semiconductor device according to claim 1, wherein
the at least one hole is formed in a position other than an upper side of the shunt resistance.

9. The semiconductor device according to claim 1, wherein
the partition member is integrated with the container body or the first cover.

* * * * *